US009110383B2

(12) United States Patent
Goehnermeier

(10) Patent No.: US 9,110,383 B2
(45) Date of Patent: Aug. 18, 2015

(54) PROJECTION EXPOSURE METHOD AND PROJECTION EXPOSURE SYSTEM THEREFOR

(75) Inventor: Aksel Goehnermeier, Essingen-Lauterburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 944 days.

(21) Appl. No.: 13/299,062

(22) Filed: Nov. 17, 2011

(65) Prior Publication Data

US 2012/0069318 A1 Mar. 22, 2012

Related U.S. Application Data

(62) Division of application No. 11/817,903, filed as application No. PCT/EP2005/007651 on Jul. 14, 2005, now Pat. No. 8,081,295.

(30) Foreign Application Priority Data

Mar. 15, 2005 (DE) .......................... 10 2005 013 664

(51) Int. Cl.
*G03B 27/54* (2006.01)
*G03B 27/72* (2006.01)
*G03F 7/20* (2006.01)

(52) U.S. Cl.
CPC ............ *G03F 7/70566* (2013.01); *G03F 7/701* (2013.01); *G03F 7/70141* (2013.01); *G03F 7/70425* (2013.01); *G03F 7/70433* (2013.01)

(58) Field of Classification Search
CPC . G03F 7/701; G03F 7/70141; G03F 7/70425; G03F 7/70433; G03F 7/70566
USPC ................................................ 355/71, 67, 53
See application file for complete search history.

(56) References Cited

U.S. PATENT DOCUMENTS

| 5,627,626 A | 5/1997 | Inoue et al. |
|---|---|---|
| 5,933,219 A | 8/1999 | Unno |
| 6,049,374 A | 4/2000 | Komatsuda et al. |

(Continued)

FOREIGN PATENT DOCUMENTS

| DE | 41 24 311 | 1/1993 |
|---|---|---|
| DE | 10 010 131 | 9/2001 |

(Continued)

OTHER PUBLICATIONS

Machine translation of JP 2004-311639, dated Nov. 4, 2011.

(Continued)

*Primary Examiner* — Peter B Kim
(74) *Attorney, Agent, or Firm* — Fish & Richardson P.C.

(57) ABSTRACT

The disclosure provides a projection exposure method for exposing a radiation-sensitive substrate with at least one image of a pattern of a mask. The mask has a first pattern area with a first subpattern, and at least one second pattern area, arranged laterally offset from the first pattern area, with a second subpattern. The first subpattern is irradiated during a first illumination time interval with a first angular distribution, adapted to the first subpattern, of the illumination radiation. Thereafter, the second subpattern is irradiated during the second illumination time interval with a second angular distribution, adapted to the second subpattern, of the illumination radiation, said second angular distribution differing from the first angular distribution.

25 Claims, 7 Drawing Sheets

(56) References Cited

U.S. PATENT DOCUMENTS

| | | |
|---|---|---|
| 6,396,567 B1 | 5/2002 | Chu et al. |
| 6,433,854 B2 | 8/2002 | Baker et al. |
| 6,583,855 B2 | 6/2003 | Krikke et al. |
| 6,608,665 B1 | 8/2003 | Nishi et al. |
| 6,628,370 B1 | 9/2003 | McCullough et al. |
| 6,855,486 B1 | 2/2005 | Finders et al. |
| 6,930,754 B1 | 8/2005 | Sugita et al. |
| 2001/0055103 A1 | 12/2001 | Nishi |
| 2002/0109827 A1 | 8/2002 | Nishi |
| 2002/0126267 A1 | 9/2002 | Smith |
| 2003/0038225 A1 | 2/2003 | Mulder et al. |
| 2003/0197842 A1 | 10/2003 | Tsacoyeanes et al. |
| 2003/0197846 A1 | 10/2003 | Coston et al. |
| 2004/0108467 A1 | 6/2004 | Eurlings et al. |

FOREIGN PATENT DOCUMENTS

| | | |
|---|---|---|
| DE | 103 43 333 | 4/2005 |
| EP | 0 747 772 | 12/1996 |
| EP | 0 969 327 A2 | 1/2000 |
| EP | 1 020 769 A2 | 7/2000 |
| EP | 1 168 083 | 1/2002 |
| EP | 1 262 836 | 12/2002 |
| EP | 1 357 431 A2 | 10/2003 |
| JP | 05-267124 | 10/1993 |
| JP | H06-267825 | 9/1994 |
| JP | 7-153659 | 6/1995 |
| JP | 8-008177 | 1/1996 |
| JP | H08-008177 | 1/1996 |
| JP | 2001-274083 | 10/2001 |
| JP | 2002-064058 | 2/2002 |
| JP | 2003-022967 | 1/2003 |
| JP | 2003-338459 | 11/2003 |
| JP | 2004-311639 | 11/2004 |
| JP | 2004-319780 | 11/2004 |
| JP | 2005-026649 | 1/2005 |
| WO | WO 02/05029 | 1/2002 |
| WO | WO 03/023832 | 3/2003 |
| WO | WO 2005/031467 | 4/2005 |

OTHER PUBLICATIONS

English translation of Japanese Office Action for corresponding JP Appl No. 2008-501168, dated Dec. 26, 2011.

Japanese office action, and English translation thereof, for JP Application No. 2008-501168, dated Mar. 12, 2013.

An International Search Report from the counterpart PCT Application No. PCT/EP2005/007651, dated Mar. 20, 2006, 5 pages.

Fig. 8
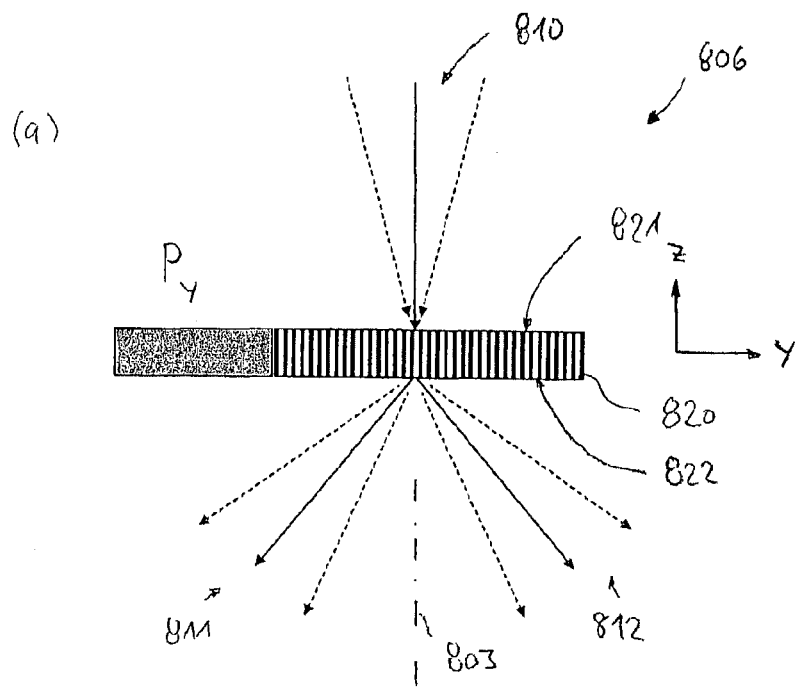
(a)
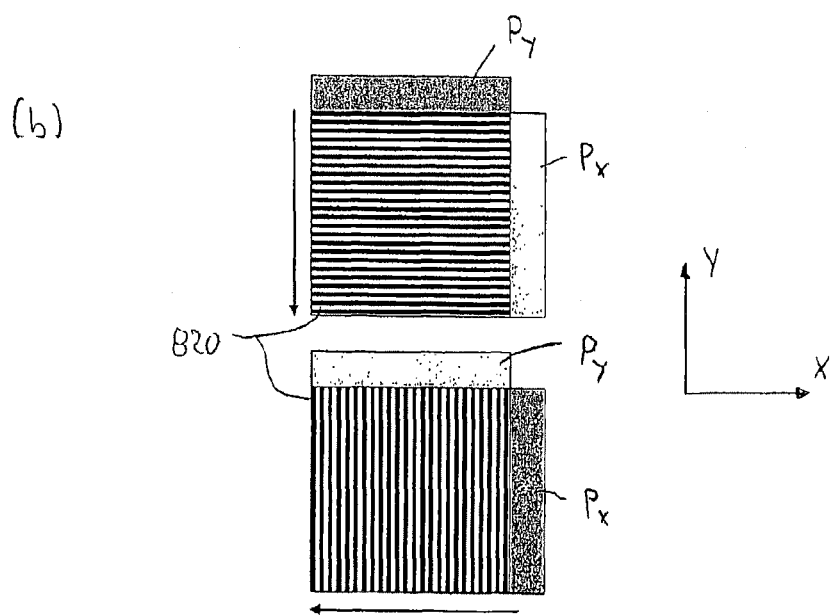
(b)

PROJECTION EXPOSURE METHOD AND PROJECTION EXPOSURE SYSTEM THEREFOR

CROSS-REFERENCE TO RELATED APPLICATIONS

This is a divisional application of U.S. application Ser. No. 11/817,903, filed Apr. 22, 2008, which is a National Phase application under 35 U.S.C. §371 filed from International Patent Application Serial No. PCT/EP2005/007651, filed on Jul. 14, 2005, which claims priority to German Patent Application Serial No. 10 2005 013 664.8, filed on Mar. 15, 2005. U.S. application Ser. No. 11/817,903 is incorporated herein by reference.

The invention relates to a projection exposure method for exposing a radiation-sensitive substrate, arranged in the region of an image surface of a projection objective, with at least one image of a pattern of a mask arranged in the region of an object surface of the projection objective, and to a projection exposure system suitable for carrying out the method.

Microlithographic projection exposure methods are currently predominantly used for fabricating semiconductor components and other finely structured components. Use is made of masks (reticles) that bear the pattern of a structure to be imaged, for example a line pattern of a layer of a semiconductor component. A mask is positioned in a projection exposure system between an illumination system and projection objective in the region of the object surface of the projection objective, and illuminated with the aid of an illumination radiation provided by the illumination system. The radiation varied by the mask and the pattern runs as projection radiation through the projection objective, which images the pattern of the mask onto the substrate to be exposed, which normally bears a radiation-sensitive layer (photoresist).

When a lithography process is being designed, line widths are adapted to the reticle in such a way that the desired feature sizes in the photosensitive layer are exposed after imaging with the aid of the projection objective by using an optimum illumination. It is important in this process that the same features of the mask are imaged straight away in the photoresist independently of location on the substrate. Otherwise, speed losses that reduce price or, in the most unfavorable case, even functional losses can occur with semiconductor components.

The width of a feature in the photoresist is determined by the radiant energy deposited there. In a conventional approximation, it is assumed that the photoresist is exposed above a specific amount of deposited radiant energy, and not exposed below that. The limiting value for the amount of radiant energy is also denoted as "resist threshold". The magnitude of the radiant energy deposited at a specific location in the photoresist depends, inter alia, on optical aberrations, in particular of the projection objective, on the polarization state of the exposure radiation, and on the influence of scattered light and double reflections. What is decisive here is the radiant intensity integrated at a site on the substrate during a total exposure time.

It has emerged that the lithography process reacts very sensitively to extremely small changes in the process or during the imaging. Thus, service life effects such as contamination or degradation can cause feature widths to change more strongly or less strongly depending on their ambient parameters. Particular problems can be added when masks with greatly different features are used within the pattern (layout variations). This is the case, for example, whenever pattern areas with relatively dense features are present next to pattern areas with isolated features within a pattern.

In order to avoid the above-named service life effects, it is attempted to eliminate a global offset in the feature width by adapting the exposure period and/or the exposure energy. If the variation in the line widths in different environments is too large, there is a need in general to develop a new layout for the pattern, and thus a new reticle. With reference to the layout variations, a process is generally selected in which the illumination constitutes a compromise that permits acceptable imaging for all features present within a pattern. Where this is not possible, a pattern is frequently split into two or more individual patterns that in turn include features tending to be standardized. Subsequently, a double exposure or multiple exposure of the substrate is carried out wherein initially a first pattern is completely transferred, and thereafter the second and, if appropriate, further patterns successively. In the case of methods with multiple exposure, it is disadvantageous that the throughput of exposed substrates is very low. Moreover, the requirements placed on the correctly positioned superposed exposure in the case of sequentially performed exposures (overlay) are very high, as a result of which the process becomes more expensive.

Numerous proposals have already been made for avoiding locationally dependent line width variations. These are also denoted below as "variation in the critical dimensions" or "CD variation". Consequently, a uniform width of imaged identical features over the field, the so-called "CD uniformity (CDU)" constitutes an important quality criterion of lithography processes.

U.S. Pat. No. 6,049,374 describes a projection exposure system for microlithography in which a transmission filter having a transmission function that can be set in dependence on location is arranged inside the illumination system. On the basis of a locationally dependent measurement of the illumination intensity distribution in the image plane of the projection objective, the illumination intensity can be set as a function of location with the aid of the setting of a suitable locationally dependent transmission of the transmission filter in such a way that the line width of the imaged feature can be controlled in a locationally dependent fashion. The illumination intensity of the wafer stepper is varied in this case statically over a field to be imaged or over a feature to be imaged. It is possible in addition to compensate possible dose fluctuations via appropriate neutral density filters in the region of field planes.

U.S. Pat. No. 6,608,665 B1 describes a projection exposure system for microlithography in which the pattern of a mask is successively imaged onto a substrate by scanning. In the process, the illumination radiation falls onto the mask in a slit-shaped illumination field, and the mask is moved relative to the illumination field until the entire pattern of the mask is transferred onto the substrate moving synchronously with the mask. The slit width of the illumination field can be varied during the scanning process with the aid of a rectangular diaphragm that is arranged inside the illumination system in or in the vicinity of a field plane of the illumination system, and of a further near-field diaphragm that is arranged in the vicinity of this diaphragm and whose aperture width in the scanning direction can be varied during scanning. It is possible thereby to set different exposure periods for different regions of the mask. Different illumination settings for a respective scanning process can be set with the aid of exchangeable pupil filters inside the illumination system.

U.S. Pat. No. 5,933,219 describes a projection exposure system for microlithography, in which the pattern of a mask is transferred successively onto a substrate in a scanning process. The illumination system operates with polarized light. In laterally offset regions, the mask has mask patterns that extend in different directions. The polarization direction of the illumination light is varied during the scanning process such that the individual mask regions are respectively illuminated with polarized light whose polarization direction runs in the longitudinal direction of the respective subpattern.

WO 02/05029 describes exposure methods for microlithography in the case of which there is set in a pupil-shaping surface of the illumination system an illumination intensity distribution that has four angular illumination spots (chevrons) within a circular pupil. This illumination is optimized for features in which lines are present in mutually perpendicular directions.

U.S. Pat. No. 6,433,854 B2 describes an illumination system of a projection exposure system in which the uniformity of the intensity of the illumination radiation is to be improved by filters inside the illumination system.

Further methods for influencing the local illumination intensity distribution in a pupil-shaping surface of an illumination system of a microlithography projection exposure system are exhibited in US 2002/0126267 A1 and U.S. Pat. No. 6,583,855 B2.

The control of the intensity distribution in the projection radiation is also treated in numerous other documents. WO 03/023832 exhibits a projection exposure system having rotatable profile filters with a trough-shaped transmission profile for correcting short-term variations in the uniformity of the illumination perpendicular to the scanning direction of a scanner system. Patent application US 2001/0055103 A1 exhibits a projection exposure system for a wafer scanner in the case of which two filters with a line pattern are moved opposite to one another during scanning. A third filter serves the purpose of coarse correction. Whereas a parallel movement is intended to improve the uniformity of the illumination, a perpendicular movement improves the telecentricity. The filters are arranged outside field planes of the illumination system between field and pupil. U.S. Pat. No. 6,396,567 exhibits a projection exposure system in which there are provided for controlling the radiation dose falling onto the wafer attenuation filters of annular shape that exhibit partially transparent material or partially reflecting material.

Patent application US 2003/0038225 A1, or the as yet unpublished German patent application DE 103 43 333.3 from the applicant exhibits illumination systems for microlithography projection exposure systems in which a light distribution device for receiving light of a primary light source and for producing a two-dimensional intensity distribution that can be variably set in a pupil-shaping surface of the illumination system comprises a micromirror arrangement with individually drivable individual mirrors, which can vary the angular distribution of the radiation falling onto the mirror elements specifically so as to produce the desired illumination intensity distribution before the start of the exposure in the pupil-shaping surface.

It is an object of the invention to provide a projection exposure method and a projection exposure system that permit a reduction or avoidance of field-dependent feature width variations by comparison with conventional systems. The aim, in particular, is to provide a projection exposure method and a projection exposure system with the aid of which masks having layout variations can be imaged with an improved image fidelity. It is another object of the invention to provide a projection exposure method and a projection exposure system that permit the line width produced in a substrate to be controlled as a function of location when using a scanner system.

In accordance with one formulation of the invention, the invention provides as a way of achieving this and other objects a projection exposure method for exposing a radiation-sensitive substrate, arranged in the region of an image surface of a projection objective, with at least one image of a pattern of a mask arranged in the region of an object surface of the projection objective, which comprises the following steps:

arranging the mask in the region of the object surface of the projection objective, the mask having a first pattern area with a first subpattern, and at least one second pattern area, arranged laterally offset from the first pattern area, with a second subpattern;

illuminating the mask with the aid of illumination radiation from an illumination field of an illumination system in order to produce a projection radiation varied by the mask;

a defined, local illumination intensity distribution of the illumination radiation being set in a pupil-shaping surface of the illumination system;

illuminating the first subpattern during a first illumination time interval, a first angular distribution, adapted to the first subpattern, of the illumination radiation striking the first subpattern being set during the first illumination time interval; and subsequently illuminating the second subpattern during a second illumination time interval, a second angular distribution, adapted to the second subpattern, of the illumination radiation striking the second subpattern being set during the second illumination time interval, said second angular distribution differing from the first angular distribution.

In projection exposure methods of the type considered here, the mask is illuminated with the aid of an illumination system that forms from the light of a primary light source, in particular a laser, illumination radiation that is directed onto the mask and is defined by specific illumination parameters. The illumination radiation within an illumination field (surface of defined shape and size) impinges on the mask, the shape and size of the illumination field being constant as a rule, that is to say not variable. For example, the aim as a rule within the illumination field is an intensity distribution that is as uniform as possible, for which purpose it is possible to provide homogenizing devices, for example, light mixing elements such as fly's eye condensers and/or rod integrators, inside the illumination system. Moreover, depending on the type of features to be imaged there is frequently a need for different illumination modes that can be characterized by different spatial intensity distributions of the illumination radiation in the pupil-shaping surface of the illumination system. Associated herewith in the case of the conventional illumination settings, for example, are round illumination spots of different diameter centered around the optical axis of the illumination system and, in the case of non-conventional off-axis types of illumination, annular illumination as well as polar intensity distributions, for example dipole illumination or quadrupole illumination. Each local or spatial (two-dimensional) illumination intensity distribution in the pupil-shaping surface corresponds to an angular distribution of the radiation at the location of the mask, to the extent that the pupil-shaping surface lies in the region of a surface transformed by Fourier transformation into a mask surface, or in a surface equivalent thereto. This angular distribution essentially determines the angular distribution of the projection radiation after interaction with the mask, the projection radiation further including the information produced by diffraction at the pattern of the mask. The projection radiation penetrates the projection objective and is brought together by the latter onto the photosensitive substrate in the image surface of the projection objective for the purpose of producing an image of the pattern of the mask.

If a scanning of the mask, for example by relative movement between the mask and the illumination field of the illumination system, is carried out during an exposure in such a way that initially the first subpattern and thereafter the second subpattern are irradiated with the illumination radiation of the illumination field, it is then possible to set optimum exposure conditions at different instants at different sites or in different regions of the mask. Of course, it is possible to implement more than two different exposure conditions during a total exposure operation within three or more illumination time intervals.

The exposure time required in order to image the entire pattern of a mask onto the substrate is denoted here as "total exposure time". In scanner systems, the illumination field is smaller in one direction (scanning direction) than the pattern of the mask, and the mask is scanned in this direction so that pattern areas laterally offset from one another are imaged successively in time. In the case of projection exposure methods according to the invention, the total exposure time is subdivided into at least two illumination time intervals that follow one another directly or with an interruption and are each shorter than the total exposure time. During a first exposure time interval, a first angular distribution of the illumination radiation falling onto the pattern is set which can, for example, be determined substantially by the associated illumination intensity distribution in the pupil-shaping surface. During the following second exposure time interval, there is a second angular distribution, different therefrom, of the illumination radiation falling onto the pattern, with which there is associated as a rule, but not necessarily, another illumination intensity distribution in the pupil-shaping surface. The first angular distribution can be adapted to the first subpattern in such a way that the latter is optimally or virtually optimally imaged, whereas, if appropriate, the first angular distribution is not optimum for imaging the second subpattern. The second angular distribution can, by contrast, be adapted to the second subpattern such that the latter is imaged optimally, whereas, if appropriate, the second angular distribution would be relatively unfavorable for imaging the first subpattern. The temporal juxtaposition of a number of illumination time intervals with different imaging conditions therefore renders it possible to set optimum imaging conditions for each subpattern of a mask over a certain time such that after the total exposure time has elapsed, all of the subpatterns have been imaged under the imaging conditions respectively optimum for them.

The following method steps are carried out in the case of preferred variants:

setting a first illumination intensity distribution, adapted to the first subpattern, in the pupil-shaping surface of the illumination system;

illuminating the first subpattern with the aid of the first illumination intensity distribution within the first illumination time interval;

varying the illumination intensity distribution in the pupil-shaping surface in order to produce a second illumination intensity distribution that differs from the first illumination intensity distribution; and illuminating the second subpattern with the aid of the second illumination intensity distribution within a second illumination time interval following the first illumination time interval.

It is thereby provided to carry out a dynamic manipulation of the illumination pupil during an illumination operation for an individual mask. The term "illumination pupil" stands here for the defined, local (spatial) illumination intensity distribution of the illumination radiation in the pupil-shaping surface of the illumination system.

It is thereby possible, in particular, to adapt the illumination pupil dynamically in a specific fashion during a scanning process in order to set the optimum exposure conditions successively for the features of the corresponding subpatterns that are currently to be exposed during the scanning for the respective pattern area of a reticle.

It is thereby possible to illuminate different sites of a mask with different illumination settings at different instants or in different time intervals.

In order to change illumination settings within a total exposure time provided for a mask, the change should be possible between illumination settings more rapidly than has previously been customary with conventional illumination systems. Rates of change in the order of magnitude of the clock frequency of a pulsed laser used as light source can be advantageous. Since, in the case of conventional illumination systems, an illumination setting is generally set before an exposure and no longer changed during the exposure, illumination systems of conventional projection exposure systems need not be designed for changing settings in such a rapid way. There, the illumination pupil is set, for example, with the aid of zoom axicon systems in conjunction with diffractive and/or refractive optical elements before the exposure in each case, and then remains constant during the total exposure time. In order to enable a rapid change between various illumination settings within a total exposure time, the following steps are carried out in a preferred variant of the projection exposure method:

setting a basic illumination intensity distribution in the pupil-shaping surface of the illumination system, the basic illumination intensity distribution being substantially a superposition of the first and second illumination intensity distributions;

masking out a fraction, corresponding to the second illumination intensity distribution, of the basic illumination intensity distribution in order to produce the first illumination intensity distribution; and subsequently masking out from the basic illumination intensity distribution in order to produce the second illumination intensity distribution a fraction, corresponding to the first illumination intensity distribution, of the basic illumination intensity distribution.

The basic illumination intensity distribution can be set in a conventional way, for example with the aid of a zoom axicon system in conjunction with refractive and/or diffractive optical elements. It can, for example, essentially be fashioned as the sum of two different dipole illuminations with poles of different size and/or different radial spacing from the optical axis and/or different rotation position with reference to the optical axis. By alternately masking out firstly one and then the other illumination spot, it is possible to implement successively two or more different dipole illuminations that are respectively adapted to differently aligned line features and/or to line features of different periodicity lengths within a mask pattern.

For the purpose of rapidly masking out a fraction of the basic illumination intensity distribution, it is possible for example, to use a suitable transmission filter device that has a spatially variable transmission function. Alternatively or in addition, it is also possible to use at least one reflection filter device that has a spatially variable reflection function. Filter arrays with individually drivable individual elements for implementing a transmission function that can be varied in a locationally dependent fashion can be implemented, for example, by means of LCD elements or other controllable individual elements. A reflection filter device can be implemented, for example, by means of a micromirror array. The filter device and an assigned control device are to be designed such that at least one change of the filter function is possible within a total exposure time.

It is provided in another embodiment to carry out the masking out of a fraction of the basic illumination intensity distribution with the aid of one or more moveable diaphragm devices that can, for example, be designed as a diaphragm rotating about the optical axis. A diaphragm opening which can move relative to the basic illumination intensity distribution can be moved in this case such that during the movement of the diaphragm device, for example during rotation of the diaphragm about the optical axis, initially a fraction that corresponds to the second illumination intensity distribution is masked out, and only the fraction that corresponds to the first illumination intensity distribution is passed, while in a subsequent rotational position a fraction of the basic illumination intensity distribution that corresponds to the first illumination intensity distribution is masked out, and the fraction associated with the first illumination intensity distribution is passed. Such a diaphragm, which "cuts out" different illumination settings from a basic illumination intensity distribution at different instants within a total exposure time, is preferably to be driven such that the movement, for example the rotation, is coordinated with the pulse frequency and the pulse instants of a pulsed laser light source.

It is also possible that during a total exposure time that includes the first illumination time interval and the second illumination time interval, a variably drivable light distribution device for receiving light of a primary light source and for producing a variably settable local illumination intensity distribution in the pupil surface of the illumination system is used firstly to set a first illumination intensity distribution corresponding to the first angular distribution, and thereafter to set a second illumination intensity distribution corresponding to the second angular distribution.

This purpose requires variably drivable light distribution devices that permit a rapid switchover to different illumination settings within a fraction of typical total exposure times. In preferred embodiments, the light distribution device includes at least one light manipulation device for controllably varying an intensity distribution of incident light in the space domain and/or in the angular domain, and during the total exposure time this light manipulation device is switched over at least once between a first configuration and a configuration differing therefrom.

In a development, the light modulation device has a mirror arrangement with a field of individually controllable individual mirrors for varying the angular distribution of the radiation striking the mirror arrangement. The individual mirrors of such a micromirror array can be arranged like a raster in a one- or two-dimensional field. In accordance with another development, the light modulation device has at least one electrooptic element that preferably comprises a one- or two-dimensional field arrangement (array) of switchable diffraction gratings, or a corresponding field of acoustooptic elements. Each of these individual elements that are arranged like a raster and can correspondingly also be denoted as raster elements, introduce at the location of the raster element a specific angle or a specific angular distribution of the output radiation, a beam deflection of the incident radiation, that is to say a change in the propagation direction, being introduced as a rule. It is possible by driving the individual elements electrically, for example, to set the angular distribution of the output radiation variably in order to effect a change in the diffraction characteristics between the first and the second illumination time intervals.

In one embodiment, the light modulation device has at least one dynamically drivable, diffractive optical element (DOE) that has diffractive structures diffracting radiation and that can be driven in the short term by an external drive in order to cause a change in the diffractive angular distribution. For example, a plane-parallel plate made from transparent material can be provided, at whose edges there are fitted at one point or at various points piezoelectric elements with the aid of which sound waves can be coupled into the plate. By specific tuning of the excitation frequency, standing longitudinal waves are produced in the plate, as a result of which the plate acts as phase grating for light passing through. A change in the diffractive angle or in the diffractive angle distribution is possible by adapting the frequency. By varying the amplitude, the degree of extinction can be adapted to the zero diffraction order. If, for example, wave patterns are produced in the form of line gratings of different alignment, it is possible thereby to produce dipole illuminations with different alignments of the poles in temporal succession.

As an alternative, or in addition to varying the defined local illumination intensity distribution in the pupil-shaping surface of the illumination system, it is also possible to achieve a change in the angular distribution of the illumination radiation between the first and the second illumination time intervals by virtue of the fact that an angularly dependent variation of the illumination radiation is introduced in the region of a field plane of the projection system in the beam path upstream of the pattern to be illuminated. In one embodiment, a spatially varying antireflection coating is provided for this purpose on the rear side of the mask facing the illumination system. The antireflection coating has a first angular dependence of the reflection-reducing action in the region of the first subpattern, and a second angular dependence, different therefrom, of the antireflection action, in the region of the second subpattern. It is thereby possible for specific illumination angle ranges to be attenuated to a greater or lesser degree as a function of the configuration of the assigned subpatterns, in order to attain optimum optical imaging conditions for all subpatterns in each case. Such an antireflection coating can also be provided at a separate element—exchangeable, if appropriate—in the vicinity of the rear side of the reticle.

In a scanner system, a mask with a spatially varying layer of the described type can be arranged with reference to the scanning direction such that the regions of differently active coating are covered in temporal succession by the illumination field. It is also possible as an alternative or in addition to provide pattern areas arranged in a laterally offset fashion in a direction transverse to the scanning direction, in particular perpendicularly to the scanning direction. Masks with at least two laterally offset subpatterns that are assigned a layer adapted to the distribution of the subpatterns and having a spatially varying optical power differing in the regions assigned to the subpatterns can also be used with a wafer stepper, it then being possible to produce different illumination intensity distributions and/or different polarization distributions at the same time for the juxtaposed subpatterns.

It is known that the polarization state of the output radiation emerging from the projection objective and directed onto the substrate, the so-called "output polarization state", likewise exerts on the imaging quality an influence that plays an increasingly important role for increasing numerical apertures. In this context, the vector character of the electric field producing the image becomes more clearly noticeable for high numerical apertures, for example with values of NA=0.85 or above. For example, the s-polarized component of the electric field interferes more effectively and produces a better contrast than the p-polarized component, which oscillates perpendicularly thereto. By contrast, p-polarized light generally couples more effectively into the photoresist. Consequently, the output polarization state can be used as manipulator for influencing the imaging:

It is provided in a development to carry out a variable setting of the output polarization state at the projection exposure system with the aid of at least one polarization manipulation device, the latter being switched over at least once between a first configuration and a second configuration within a total exposure time such that the first subpattern is imaged with a first output polarization state, and the second subpattern is imaged with a second output polarization state differing therefrom. It is undertaken, in particular, for this purpose to vary the polarization characteristics of the illumination radiation directed onto the reticle, in the case of which this polarization state changes at least once during the total exposure time as a function of the type of the subpatterns. For example, it is possible to provide inside the illumination system a dynamic, that is to say switchable polarizer in the case of which, in particular, there are produced on a metallic substrate via piezoelectric elements or the like surface waves whose period is shorter than the wavelength of the illumination radiation (sub-$\lambda$ structures) and whose period can be varied by means of the excitation frequency. A rotating polarization filter or a rotating retardation element can be provided as an alternative or in addition. A rotating polarizer can be used for the purpose of converting incoming, unpolarized light into outgoing polarized light with a defined preferred polarization direction that likewise rotates about the optical axis as the element rotates about the optical axis. The rotational speed can be coordinated with the phase and phase angle of the pulses of a pulsed laser source such that the two subpatterns are exposed with a different alignment of the preferred polarization direction. A corresponding effect can be achieved with a rotating $\lambda/4$ plate when circularly polarized light is used as input light, or with the aid of a rotating $\lambda/2$ plate when linearly polarized input light is used. In each case, the time interval for the exposure is set such that the main crystallographic axis, decisive for the birefringence action, of the retardation element points in the desired direction.

In addition to emerging from the claims, the above features and further ones also emerge from the description and from the drawings, in which case the individual features can respectively be implemented on their own or as a plurality in the form of subcombinations in one embodiment of the invention, and in other fields, and can constitute embodiments that are advantageous and intrinsically capable of protection. Exemplary embodiments of the invention are illustrated in the drawings and explained in more detail below.

FIG. 8 shows in (a) a schematic section through a diffractive optical element that is designed as an acoustooptic element and in the case of which radiation-diffracting structures are produced with the aid of piezoelectrically produced sound waves, and in (b) different patterns of standing, waves inside the acoustooptic element in FIG. 8(a);

Figure 10:
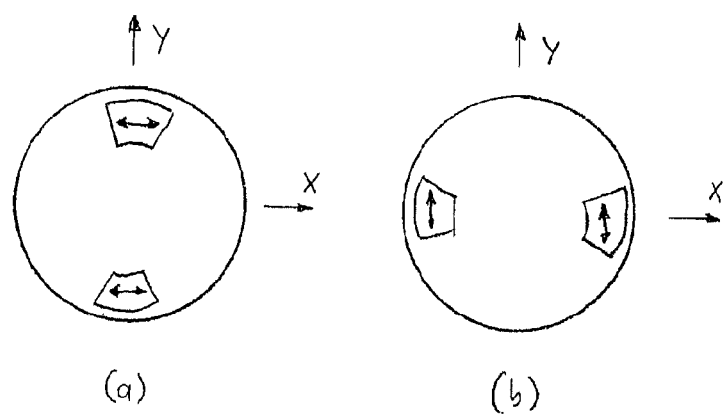
Figure 9:
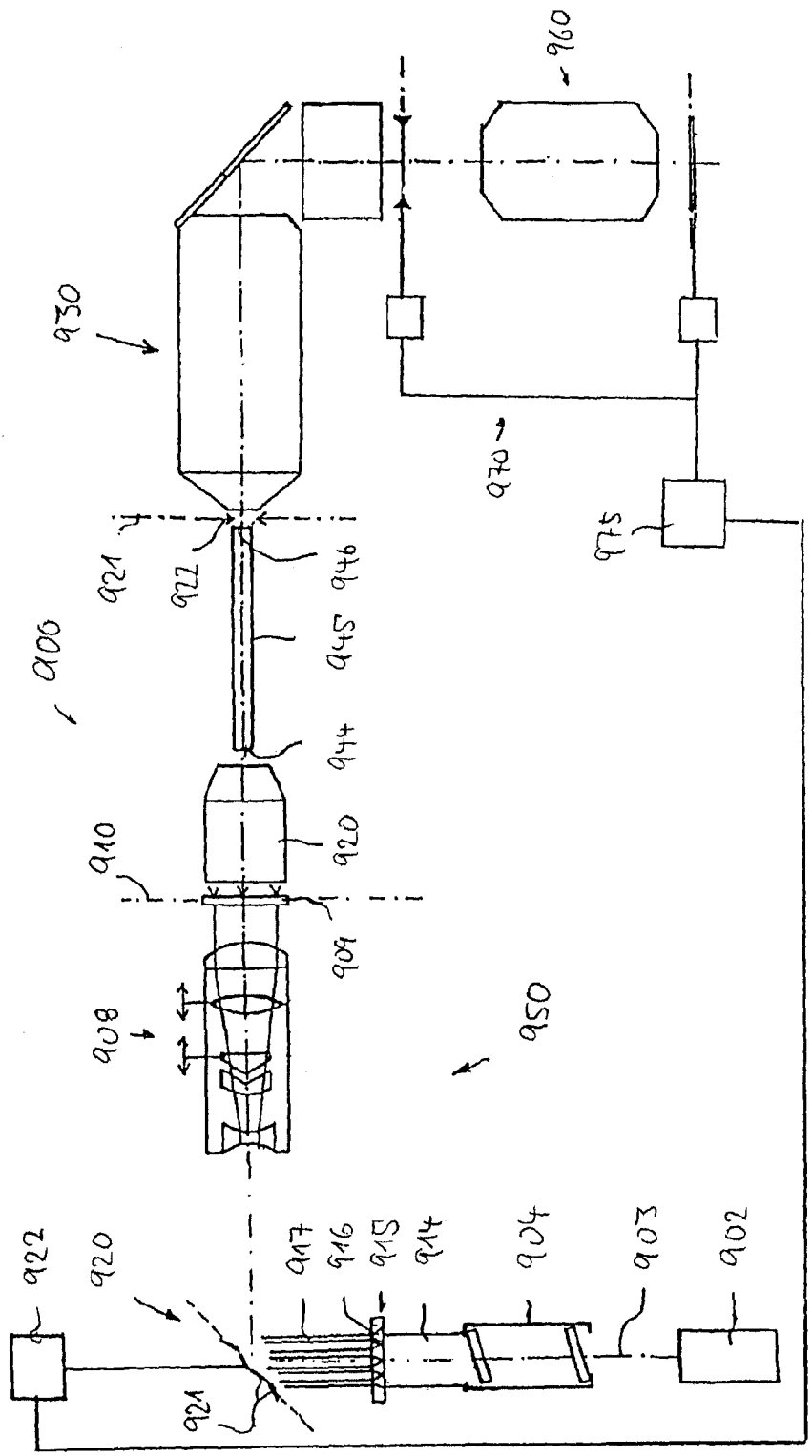

FIG. 9 shows an embodiment of a projection exposure system in which the illumination system has a light modulation device with a field of individually drivable individual mirrors that are driven as a function of signals of the scanning system; and FIG. 10 shows a schematic of two illumination pupils of dipole character that can be set in a successive fashion during a total exposure time, the set illumination radiation in each case exhibiting s-polarization with reference to the incidence plane of the illumination radiation.

Figure 1:
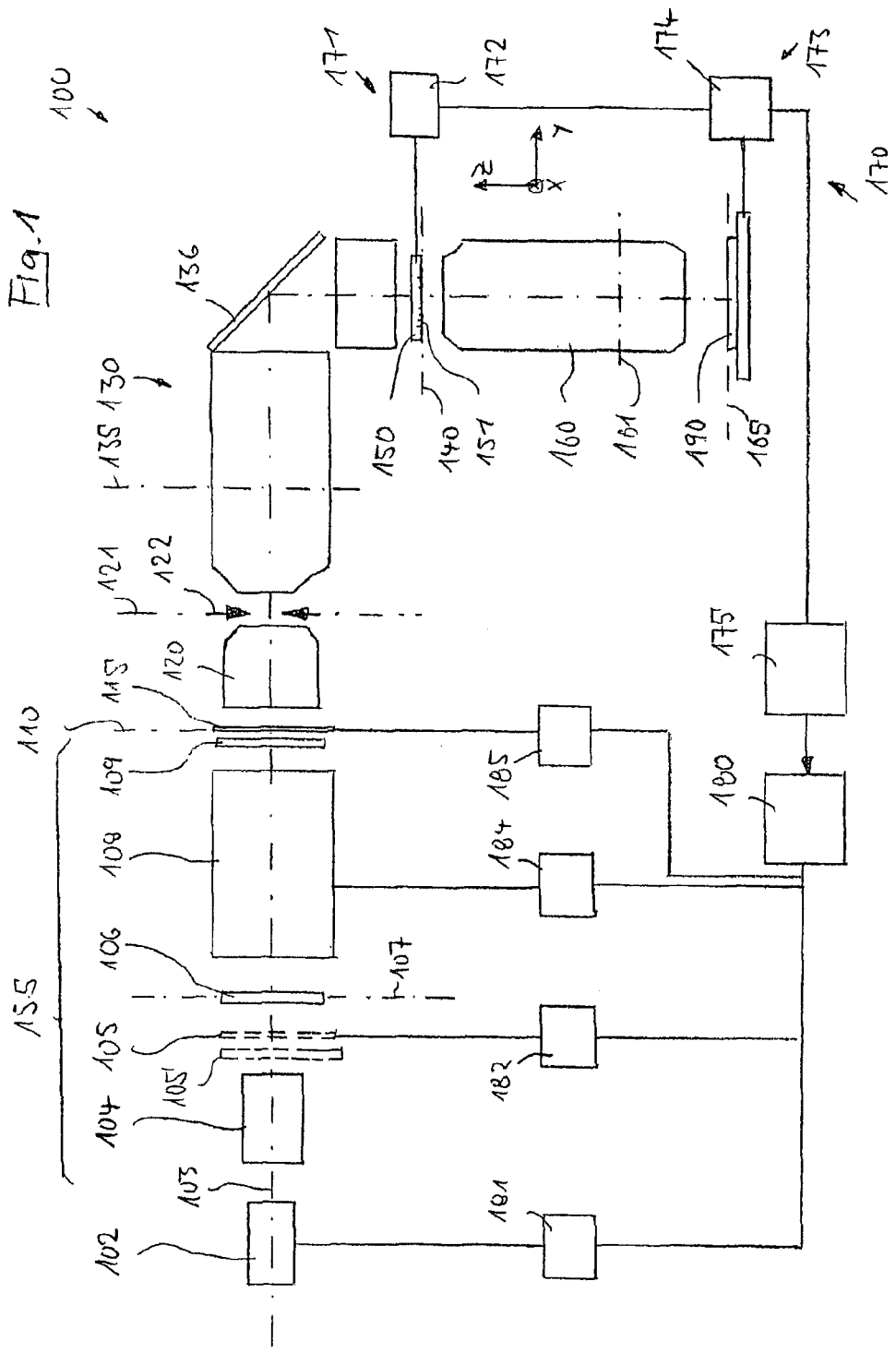
FIG. 1 shows a schematic side view of an embodiment of a microlithography projection exposure system in accordance with the invention.

FIG. 1 shows a first example of a microlithography projection exposure system 100 that can be used in the fabrication of semiconductor components and other finely structured components, and is operated with light from the vacuum ultraviolet (VUV) region in order to achieve resolutions of up to fractions of micrometers. Serving as light source 102 is an ArF excimer laser with an operating wavelength of approximately 193 nm, whose linearly polarized light beam is aligned coaxially with the optical axis 103 of the illumination system. Other UV light sources, for example $F_2$ lasers with 157 nm operating wavelength, KrF excimer lasers with 248 nm operating wavelength or mercury vapor lamps with 368 nm or 436 nm operating wavelength as well as light sources with wavelengths below 157 nm are likewise possible. The linearly polarized light of the light source 102 initially enters a beam expander 104 that can, for example, be in the form of a mirror arrangement in accordance with DE 41 24 311, and is used for coherence reduction and to enlarge the beam cross section. A polarization rotator 105 arranged down-stream thereof in the beam path is explained in more detail below. A first diffractive optical vasten element 106, which is used as a beam-shaping element, is arranged in the object plane 107 of an objective 108 arranged downstream thereof in the beam path and is designed as a variably settable part of a pupil-shaping unit 155 with the aid of which a defined, spatial (two-dimensional) illumination intensity distribution of the illumination radiation can be set in a pupil-shaping surface 110, situated downstream of the objective 108, of the illumination system. The pupil-shaping surface 110 coincides with the exit pupil of the objective 108. Arranged in the immediate vicinity of the exit pupil 110 is a refractive, second optical raster element 109 that is used as a further beam-shaping element. Arranged in the pupil-shaping surface 110, which is a pupil surface of the illumination system, is a rotating diaphragm 115 that is used as a variable pupil filter and whose design and function are explained in detail further below. Input optics 120 arranged there behind transmit the light to an intermediate field plane 121 in which a reticle/masking system (REMA) 122 is arranged that is used as an adjustable field diaphragm. In this embodiment, the illumination radiation is homogenized by a diaphragm unit that is positioned in the vicinity of the field intermediate plane 121, in a fashion slightly offset axially from the Rema system 122, and that is fashioned or can be set such that it shields specific edge regions of the light distribution in such a way as to enable a largely homogeneous illumination of the reticle (mask) 150 in conjunction with the integrating action of the scanning process, explained later. A device suitable for this purpose and composed of rod-shaped "finger diaphragms" that can be inserted laterally into a field dynamically and independently of one another, is shown in European Patent Application EP 1 020 769 A2 whose content is incorporated in this description by reference.

The downstream imaging objective 130 images the intermediate field plane 121 with the aid of the masking system 122 onto the reticle 150 (mask, lithography master) on a scale which can, for example, lie between 2:1 and 1:5, and is approximately 1:1 in the embodiment. The imaging is performed without an intermediate image, and so exactly one pupil surface 135, which is a Fourier-transformed surface in relation to the exit plane 140 of the illumination system, lies between the intermediate field plane 121, which corresponds to the object plane of the imaging objective 130, and the image plane 140 of the imaging objective, which corresponds to the exit plane of the illumination system and, at the same time, to the object plane of a downstream projection objective 160. A deflecting mirror 136 arranged between this pupil surface 135 and the image surface 140 and inclined by 45° to the optical axis 103 enables the relatively large illumination system (several meters in length) to be installed horizontally and to support the reticle 150 horizontally.

Those optical components that receive the light of the laser 102 and form from the light illumination radiation that is directed onto the reticle 150 are associated with the illumination system of the projection exposure system. A device 171 for holding and manipulating the reticle 150 is arranged downstream of the illumination system such that the pattern 151 arranged on the reticle 150 lies in the object plane 140 of the projection objective 160 and, for the purpose of scanner operation in a scanning direction (y-direction), can be moved in this plane perpendicular to the optical axis 103 (z-direction) with the aid of a scanner drive 172.

Following downstream of the reticle plane 140 is the projection objective 160, which acts as a reduction objective and, at a reduced scale, for example, the scale of 1:4 or 1:5, projects an image of the pattern 151 arranged on the mask 150 onto a wafer 190 that is coated with a photoresist layer and whose photosensitive surface lies in the image plane 165 of the projection objective 160. Refractive, catadioptric and catoptric projection objectives are possible. Other reduction scales, for example stronger demagnifications of up to 1:20 or up to 1:200, are possible.

The substrate to be exposed, which can be a semiconductor wafer 190 in the case of the example, is held by a device 173 that comprises a scanner drive 174 in order to move the wafer perpendicular to the optical axis in a fashion synchronous with the reticle 150. Depending on the design of the projection objective 160, this movement can be performed in a parallel or antiparallel fashion. The device 173, which is also denoted as a "wafer stage", and the device 171, which is also denoted as a "reticle stage", are a constituent of a scanner device 170 that is controlled via a scan control device 175.

The elements of the illumination system, which can be variably set, are driven via an illumination system control device 180 that is connected for the purpose of data transmission to the scan control device 173 such that the type of illumination of the reticle 150 can be coordinated with the scanning process. A light source control unit 181 is configured for the purpose of driving the laser 102 in order, in particular, to be able to set the pulse sequence of the pulsed laser and the temporal position of pulses or pulse sequences, that is to say their phase, if appropriate as a function of signals of the scan control device 173. A polarization control unit 182 is used to drive the polarization rotator 105. An objective control unit 184 is used to control the drives of moveably supported optical components inside the objective 108, which includes a zoom axicon system in the case of the example. A pupil filter control unit 185 is designed for the purpose of driving the variable pupil filter 115, it being possible, in particular, to carry out the drive in coordination with the scanner device 170 and with the control of the pulsed laser 102.

The elements of the pupil-shaping unit 155 serve the purpose of setting a defined, spatial illumination intensity distribution of the illumination radiation in the pupil-shaping surface 110 of the illumination system. In this case, the optical elements situated upstream of the pupil-shaping surface 110 produce a basic illumination intensity distribution that can be further modified by the design of the spatially resolving pupil filter 115. The spatial illumination intensity distribution, resulting therefrom, in the surface 110 is also denoted below as "illumination pupil".

The pupil-shaping surface lies at or near a position that is optically conjugate with the immediately following pupil surface 135 and with the image-side pupil surface 161 of the projection objective 160. The spatial (local) light distribution in the pupil 161 of the projection objective is thereby determined by the spatial light distribution (local distribution) in the pupil-shaping surface of the illumination system. Lying in each case between the pupil surfaces 110, 135 or 161 are field surfaces in the optical beam path that are Fourier-transformed surfaces in relation to the respective pupil surfaces. This means, in particular, that a defined local distribution of illumination intensity in the pupil-shaping surface 110 yields a specific angular distribution of the illumination radiation in the region of the downstream field surface 121 that, in turn, corresponds to a specific angular distribution of the illumination radiation falling onto the reticle 150.

Figure 2:
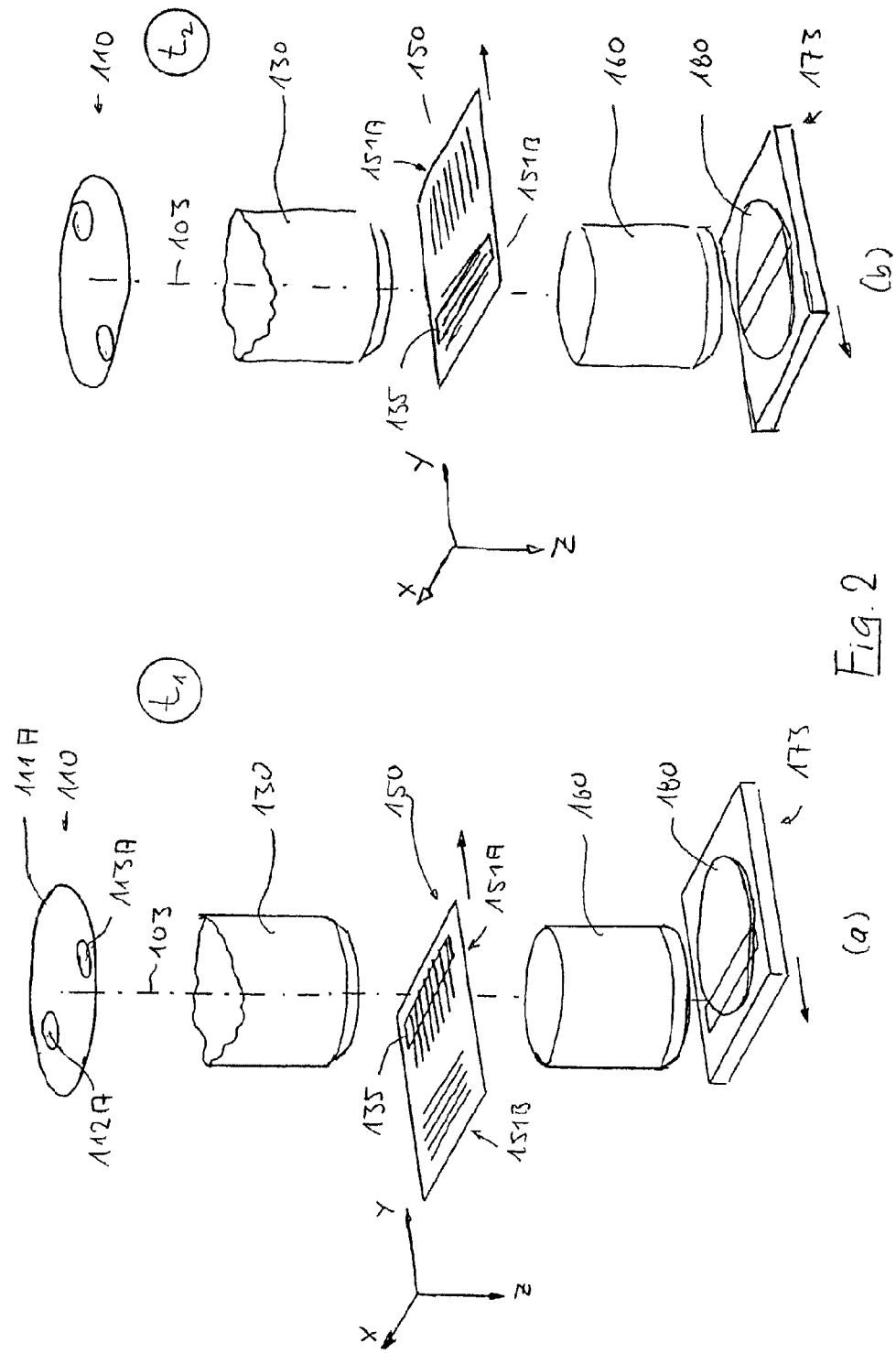
FIG. 2 shows schematic projections of an embodiment of an inventive projection exposure system in which a mask with different subpatterns is illuminated in temporally successive illumination time intervals with dipole illumination of different alignment of the illumination poles.

A particular feature of the illumination system consists in that the illumination pupil can be manipulated dynamically during an illumination operation for an individual mask, that is to say while the mask is being scanned. This is explained in more detail with the aid of the schematic perspective illustrations (not to scale) in FIG. 2. Shown there respectively from the illumination system are the region of the pupil-shaping surface 110 and the exit-side end of the imaging objective (Rema objective) 130 from which the illumination radiation directed onto the reticle 150 exits. Visible in each case in the light path downstream of the reticle is the projection objective 160 that projects a demagnified image of the mask pattern onto a subregion of the wafer 190 that is held by the wafer stage 173. The mask 150 and the substrate (wafer) 190 are moved by the scanning device during a total exposure time in antiparallel directions perpendicular to the optical axis (z-direction) such that the illumination field 135, which is generated by the illumination system and is in the form of a rectangular slit, moves over the entire pattern, which is present on the reticle 150, and said pattern is simultaneously successively transferred onto the substrate being moved in an anti-parallel fashion. The entire wafer surface is scanned in the schematic figure for reasons of enabling illustration. By contrast, it is known that when chips are being fabricated it is in each case only a small subregion of the wafer surface that is patterned and consequently scanned.

The pattern of the reticle has substantial "layout variations", that is to say strongly differing structures within the pattern. In the case of the example, there are located next to one another on the reticle a first pattern area with a first subpattern 151A and, offset therefrom in the scanning direction (y-direction), a second pattern area with a second subpattern 151B. Both subpatterns are line patterns, the lines of the first subpattern 151A running substantially parallel to the scanning direction, while the lines of the second subpattern 151B run perpendicular to the scanning direction, that is to say in the x-direction. In conventional projection systems, it is possible under these conditions for substantial field-dependent feature width variations (CD variations) to result by virtue of the fact that it is not possible to set the illumination radiation at the illumination system such that the differently aligned structural features are imaged with the same imaging quality. This problem is solved in the case of the embodiment by virtue of the fact that the spatial distribution of the illumination intensity in the pupil plane 110 is varied during the scanning operation, that is to say within the total exposure time, such that optimum exposure conditions prevail in each case for both subpatterns. At the instant $t_1$, illustrated in FIG. 2(a), at the start of the scanning operation, the first subpattern 151A is arranged in the region of the illumination field 135 and is transmitted. An illumination pupil 111A is set for this subpattern and corresponds to a dipole illumination for which two illumination spots (illumination intensity maxima) 112A, 113A are situated diametrically opposite one another in the x-direction in a fashion off axis to the optical axis 103. At the location of the first subpattern 151A, this leads to an angular distribution of the illumination radiation for which oblique illumination strikes the structural features mainly from directions that are perpendicular to the alignment of the structural features (that is to say perpendicular to the x-direction). An optimum resolution with reference to this structural direction is possible thereby.

As the scanning movement progresses, the reticle is moved successively in the scanning direction relative to the illumination field 135 such that the illumination field sweeps the second subpattern 151B in a second illumination time interval. This is shown in FIG. 2(b) for an instant $t_2$ lying within the second illumination time interval. At this instant, the dynamic change in the illumination pupil in the pupil-shaping surface 110 has set an illumination intensity distribution that corresponds to the dipole distribution for which the illumination spots arranged off axis are now offset in each case in the y-direction (scanning direction) from the optical axis 103. In this case, as well, the illumination radiation in the illumination field 135 thus strikes the structure predominantly from directions that are perpendicular to the longitudinal direction of the structural features. An optimum angular distribution of the illumination intensity is thereby also set for the second subpattern 151B, and so this subpattern can also be imaged with optimum imaging quality.

Figure 3:
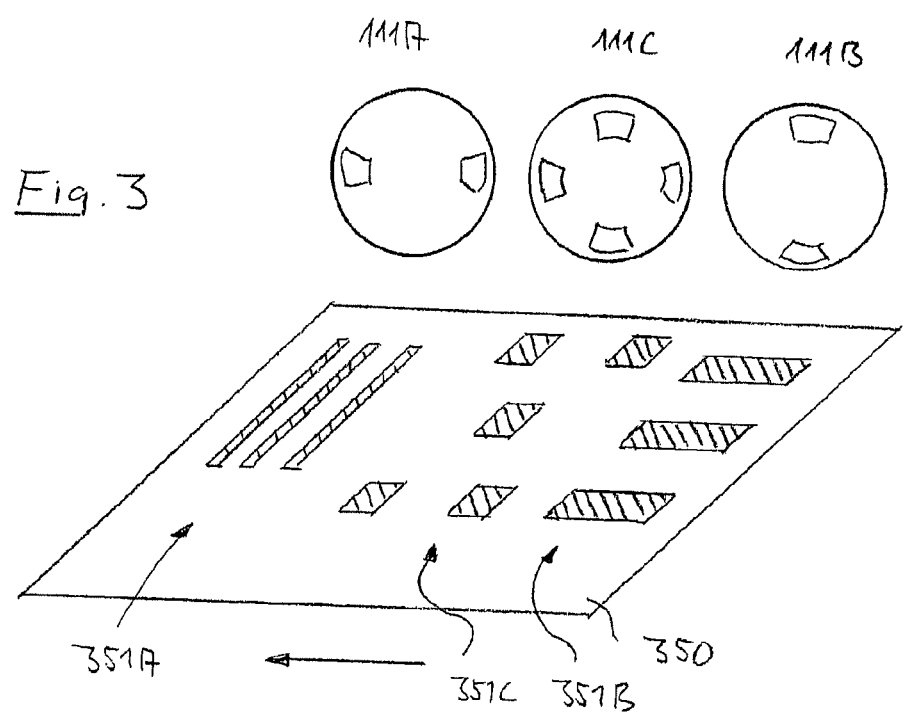
FIG. 3 shows a schematic of a mask with three juxtaposed pattern areas with different feature types and assigned illumination intensity distributions in the pupil-shaping surface during a scanning operation.

The invention is not restricted to a single change in the illumination pupil during a total exposure time. However, it is also possible to set more than two different illumination intensity distributions during a scanning sweep. FIG. 3 shows in this context a schematic of a reticle 350 with three pattern areas arranged next to one another and having subpatterns 351A, 351C and 351B. Associated illumination pupils 111A, 111C, 111B are illustrated schematically thereabout. Whereas the line patterns 351A and 351B, whose structural directions are perpendicular to one another and which are transmitted in each case at the start and at the end of the scanning operation and are arranged at the outer ends of the reticle in terms of the scanning direction are in each case illuminated optimally with dipole illuminations of different alignment, for the subpattern 351C that lies therebetween and has isolated structural features with largely the same structural dimensions in the x- and y-directions as well as approximately equal spacings between the structural features, the optimum illumination is a 4-pole illumination that can be described as a superposition or combination of two dipole illuminations aligned perpendicular to one another (illumination pupil 111C).

A particular role is played by the time instants during the switchover between different spatial distributions of the illumination intensity in the pupil-shaping surface, that is to say during the change between different illumination pupils. A typical scanner system with a pulsed laser as light source can, for example, be designed such that a field point of the substrate to be exposed experiences approximately 100 pulses of the laser for one exposure. Given a pulse frequency (pulse rate) of the order of magnitude of kilohertz (kHz), this corresponds for each field point to an exposure time that is a small fraction of a second (for example $\frac{1}{40}$ is given a pulse rate of 4 kHz). If, furthermore, the slit width, measured in the scanning direction, of the illumination field is set to a typical value, for example 40 mm, it is possible to achieve the required exposure times with scanning speeds of the order of magnitude of 1 m/s to 10 m/s or higher (approximately 1.6 m/s in the case of the example). Consequently, given the mask sizes currently customary, the total exposure time within which the entire pattern of a mask is covered once during the scanning process amounts to only fractions of seconds. The switchover between different illumination pupils must enable at least one change within this total exposure time, and so there is the need for a very rapid switchover. Typical switchover times are therefore shorter by an order of magnitude than those switchover times that are available in conventional systems, in order, for example, to switch over with the aid of the displacement of optical elements inside a zoom axicon system between conventional illumination and off-axis illumination and/or between different conventional illumination settings.

Figure 4:
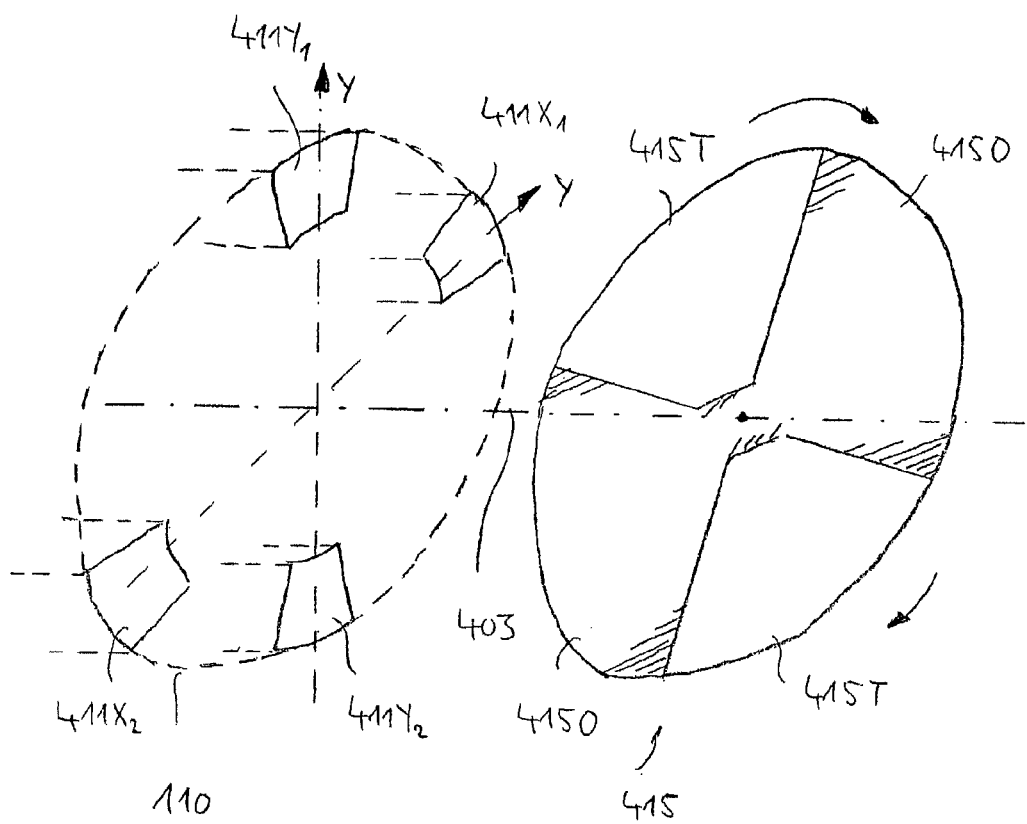
FIG. 4 shows a schematic of a section from an illumination system with a pupil filter that is designed as a rotating diaphragm whose rotation is coordinated with the pulse sequence and pulse position of pulses of a laser light source.

A possibility, implemented in the case of the embodiment in accordance with FIG. 1, of achieving a rapid change in the effective illumination pupil is explained with the aid of FIG. 4. Use is made for this purpose of a variable pupil filter 415 in the form of a diaphragm rotating about the optical axis 403. The diaphragm 415 is subdivided into four 90° sectors, two diaphragm sectors 415O lying diametrically opposite one another being opaque, while the sectors 415T offset therefrom by 90° are transparent. The diaphragm is arranged in the beam direction immediately downstream of the pupil-shaping surface 110 in which, owing to the upstream optical elements, there is arranged a basic light distribution in the form of a quadrupole distribution with four illumination spots $411X_1$, $411X_2$, $411Y_1$, $411Y_2$, that are offset in each case by 90° on the circumference and arranged outside the optical axis 403. An illumination intensity is present with each pulse of the laser in these off-axis illumination surfaces. The rotating diaphragm 415 rotates continuously, the rotational speed being tuned to the pulse frequency of the laser so as to produce for each second laser pulse the same angular position (rotary position) of the rotating pupil filter 415 (rotational speed=0.5 pulse frequency). If the phases of the laser pulses and of the rotating diaphragm are tuned to one another such that the opaque sectors 4150 in each case lie in the beam path downstream of the illumination spots 411X$_1$, 411X$_2$ lying in the x-direction, the spots are masked out by the rotating diaphragm and so only that illumination intensity which is present in the illumination spots 411Y$_1$ and 411Y$_2$ lying in the y-direction is present as "effective illumination pupil". The result is an effective illumination pupil similar to that in FIG. 2(b), which corresponds to a dipole illumination with illumination poles offset in the y-direction. As a result, the line patterns running parallel to the x-direction can be illuminated in a particularly favorable way. In order to achieve between this dipole illumination and a dipole illumination offset by 90° a change in the case of which only the illumination spots 411X$_1$ and 411X$_2$ lying in the x-direction contribute to the effective illumination pupil, the sequence of the laser pulses is retarded in the short term by a quarter of the pulse frequency with the aid of the light source control unit 181. Owing to this phase retardation, with each following laser pulse the illumination intensity of the illumination spots 411Y$_1$ and 411Y$_2$ offset in the y-direction are masked out by the opaque sectors 4150, while the intensity of the illumination spots 411X$_1$ and 411X$_2$ lying in the x-direction is passed in the region of the transparent sectors 415T. This corresponds to the effective illumination pupil 111A shown in FIG. 2(a). A rapid change between differently oriented dipole illuminations is therefore possible solely by retarding the phase of the laser pulse sequence briefly. This can be done at the required speed. There is no need to undertake any sort of mechanical manipulations at the illumination system in order to change between different illumination settings.

The rotating pupil filter 415 can be designed as a solid diaphragm in the case of which the opaque sectors are formed, for example, by a metal plate of suitable shape. The pupil filter can also be formed by a disk consisting of transparent material and in the case of which the opaque sectors are applied by means of a suitable opaque coating, for example made from a metallic material.

The principle described here by way of example consists in masking out specific regions temporarily and with a rapid change from a basic illumination intensity distribution that is present in the pupil-shaping surface and must not change during the entire exposure time. It is also possible for this purpose to make use of other transmission filter devices that have a spatially variable transmission function and can be switched over in an appropriately rapid fashion. For example, it is possible to use suitable digital filters whose transmission can be varied "pixelwise" on the basis of being driven electrically. The masking out can also be performed by using reflection filter devices that can be switched over rapidly. If, for example, the deflecting mirror 136 in FIG. 1 is arranged sufficiently close to the pupil plane 135 that spatially resolving pupil filtering is possible, it is then possible to achieve a selective masking out of portions of illumination intensity by virtue of the fact that the deflecting mirror is designed as a micromirror arrangement (compare explanations relating to FIG. 9).

In addition, these methods can further be coordinated with a movement of the diaphragm elements of the adjustable field stop 122 (REMA blades), it thereby being possible to define transition regions more clearly. For example, a first illumination setting can initially be exposed given an open field stop 122. Thereafter, the stop 122 is closed and variation of the illumination pupil is undertaken. Subsequently, the REMA blades are opened again so that the exposure operation can be continued. For the variation perpendicular to the scanning direction, the filter can further be coupled to REMA blades that can be moved in the x-direction, or via a zoom system in the objective 130. To achieve better control of the critical dimensions (CD control), the method can also be improved by using dose mappers with regard to the achievable critical dimensions (CD performance).

Figure 5:
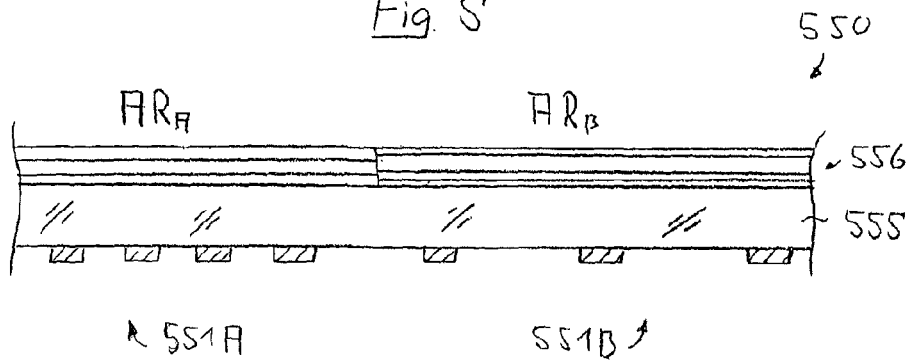
FIG. 5 shows a schematic section through an embodiment of a mask with juxtaposed mask regions with different subpatterns, each subpattern being assigned a part of an antireflection coating with spatially varying angular dependence of the transmission.
Figure 6:
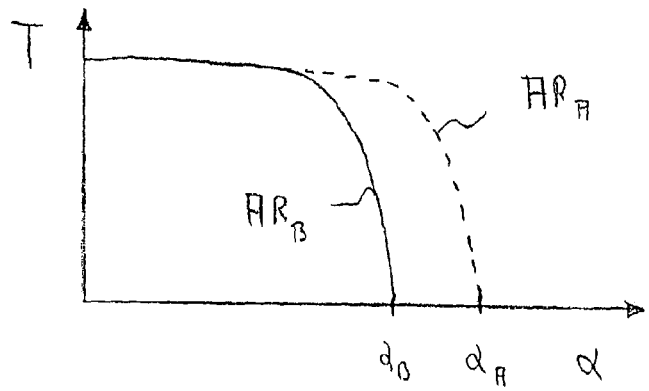
FIG. 6 shows a schematic of the angular dependence of the transmission of juxtaposed regions of the antireflection coating from FIG. 5.
Figure 7:
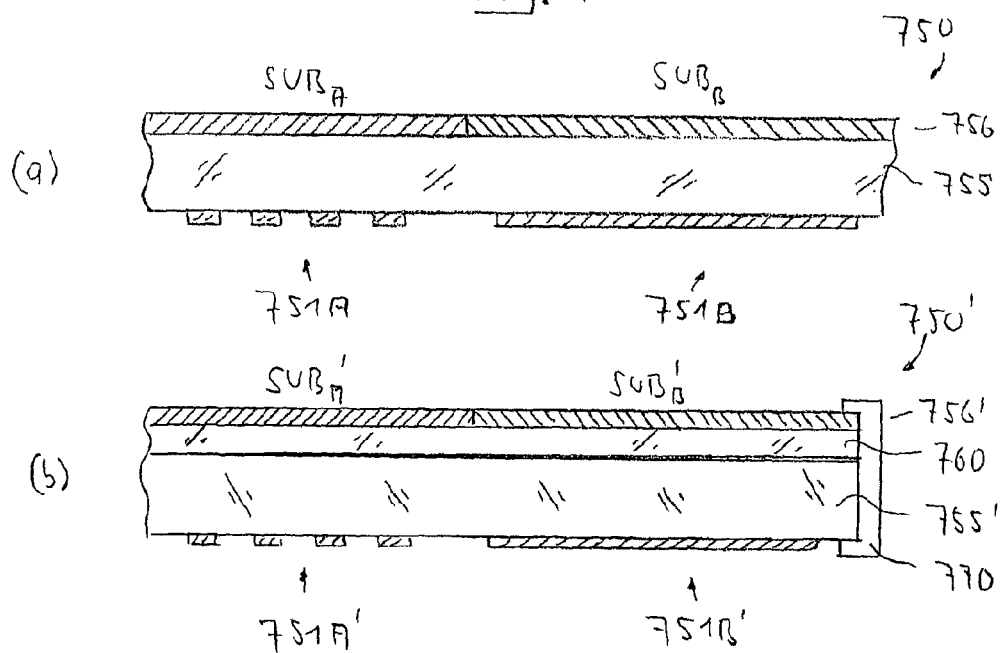
FIG. 7 shows in (a) a schematic of another embodiment of a mask with juxtaposed pattern areas with different subpatterns, each subpattern being assigned a region of a transparent coating with a sub-$\lambda$ structure, and in (b) a mask with different subpatterns that is assigned a separate plate-shaped element which bears a transparent coating with a locationally variable sub-$\lambda$ structure.

The above examples show that a spatial variation of the transmission in a pupil plane of the illumination system that is coordinated with the scanning operation enables an optimum illumination of different, juxtaposed structural regions of the mask. An analogous effect can be achieved when an angularly dependent variation of the transmission in the region of a field plane upstream of the mask structure is introduced in such a way that different pattern areas on the mask are exposed in temporal succession with different angular distributions of illumination radiation. Embodiments of particular masks that are suitable for this purpose are explained with the aid of FIGS. 5 to 7. FIG. 5 shows a schematic of a section through a mask 550. This has a transparent substrate 555 in the form of a plane-parallel plate that can, for example, consist of synthetic silica glass or calcium fluoride. A dielectric antireflection coating 556 is applied to the light entrance side, facing the illumination system in the installed state, of the substrate 555. This side is also denoted as "reticle rear side". The pattern of the mask, that is to say the mask structure, is applied in the form of opaque webs made from chromium or the like to the light exit side of the substrate, which is situated opposite and faces the projection objective in the installed state. The mask shown has layout variations, in addition to a first mask region having a first substructure 551A with structural features lying relatively close to one another there being arranged a second mask region with a second subpattern 551B whose structural features lie further apart from one another such that a coarser structure is present. The antireflection coating 556 has a number of juxtaposed regions of different optical power, a first coating region with an antireflection coating AR$_A$ being arranged opposite the first subpattern 551A, and a second coating region with a second antireflection coating AR$_B$ different therefrom being arranged opposite the coarser second subpattern 551B.

The different optical powers are effected by differences in layer thicknesses and/or materials of the individual layers of the dielectric multilayer stacks. The optical characteristics of the different regions of the antireflection coating 556 are explained with the aid of FIG. 6, which shows a schematic diagram of the transmission T of the antireflection coating as a function of the incidence angle α of the incident illumination radiation. The coating AR$_A$ assigned to the finer structure 551A exhibits good transmission as far as the vicinity of the limiting incidence angle α$_A$, and passes virtually no radiation of larger incidence angle. By contrast, the second antireflection coating AR$_B$, assigned to the coarser structure is designed such that the transmission has already dropped substantially in the case of much lower incidence angles, and so virtually no longer exhibits any transmission for a limiting incidence angle α$_B$<α$_A$. The spatial variation in the transmission of the antireflection coating has the effect that the finer substructure 551A is illuminated with a wider angular spectrum than is the coarser structure 551B lying next to it. Whereas a wide angular spectrum of the illumination radiation is available for the finer structures 551A, in the region of the coarser structures 551B those relatively large incidence angles are cut off that are not required in any case for imaging these structures and could lead to interference in the imaging. Here, as well, juxtaposed subregions of the mask are illuminated with different angular distributions of the illumination radiation. The different angular distributions can be produced here simultaneously in spatially juxtaposed regions when the illumination field is dimensioned such that a number of subregions are covered with coating regions of different effectiveness. A combination with a scanning movement is likewise possible.

It is also possible to use such coatings to implement a variation in the illumination angle distribution perpendicular to the scanning direction. Coated masks of this type can also be used with advantage in wafer steppers.

FIG. 7(a) shows a variant of a reticle 750 that likewise bears a pattern having different subpatterns 751A, 751B on its front side of the reticle, which is to be arranged in the object plane of the projection objective. Provided on the light entrance side of the transparent substrate 755 is a transparent layer 756 that has juxtaposed regions of differently designed sub-λ structures $SUB_A$ for the first substructure 751A and $SUB_B$ for the substructure 751B. Diffractive structures can produce structural birefringence that is particularly pronounced when the periodicity lengths of the diffractive structures are short against the operating wavelengths in use. No interfering higher diffractive orders are generated in the case of such sub-λ structures. In some circumstances, such layers can simultaneously have an antireflection effect. The sub-λ structures $SUB_A$ and $SUB_B$ can be designed as linear gratings with different grating constants and/or feature widths that produce at the penetrating radiation an optical path length difference dependent on the location of impingement. The individual subregions with subwavelength structures can also be formed by multilayer systems with a multiplicity of individual layers, some or all of the individual layers having an optical layer thickness that is small against the operating wavelength of the penetrating radiation. It is thereby possible to produce a so-called form birefringence. Locationally variable polarization-influencing elements, that is to say polarization-influencing elements whose effect on the polarization depends on the location of impingement of the radiation, are exhibited, for example, in the applicant's International Patent Application of reference PCT/EP03/11977, whose disclosure content in this regard is included in this description by reference.

FIG. 7(b) shows an alternative possibility for providing in the immediate vicinity of the pattern to be imaged a transparent layer that has juxtaposed regions of different optical power. As in the embodiment in accordance with FIG. 7(a), the subpatterns 751A' and 751B' of the mask arrangement 750' are arranged on the light exit side (front side) of a transparent substrate 755'. The locationally variable layer 756' with differently oriented sub-λ structures $SUB_A'$ and $SUB_B'$ is applied to a transparent plane-parallel plate 760 that is separate from the substrate 755' and is fixed in a mount 770 together with the mask substrate 755'. The plate 760 can be wrung onto the mask substrate 755' such that it is possible to dispense with a mount if appropriate. Separate optical elements of this type can also bear locationally variable antireflection coatings such as have been described, for example, in conjunction with FIG. 5. Exchangeable optical elements of this type facilitate a simplified fabrication of masks and an easy adaptation to different coating requirements.

In the case of illumination systems of the type shown in FIG. 1, the pupil-shaping device 155 is used to produce a basic illumination intensity distribution in the pupil-shaping surface 110 that remains unchanged during the total exposure time required for a scanning operation. The variable pupil filter 115 is used for short-term (dynamic) modification of the basic light distribution in a synchronous step with the scanning operation, in order to implement illumination settings of different effectiveness for different mask regions. Possibilities for producing rapidly changing basic illumination intensity distributions such that the use of variable pupil filters can be dispensed with, if appropriate, are explained below.

In the case of the illumination system of FIG. 1, the first diffractive raster element is provided for the purpose of slightly increasing the Etendue of the impinging laser radiation and of changing the shape of the light distribution so as to yield, for example, an approximate circular distribution, annular distribution or quadrupole distribution. An exchange of first raster elements can be provided for changing between these illumination modes. The second raster element 109, which is located in the exit pupil of the objective 108, is illuminated with the appropriate light distribution and forms a rectangular light distribution whose shape corresponds to the rectangular shape of the illumination field desired in the intermediate field plane 121. The annularity of the illumination and the size of the illuminated region can be adjusted by adjusting a zoom axicon inside the objective 108. Systems with these basic functions are known, for example, from EP 0 747 772 from the applicant.

Such a system can be modified for a rapid change of illumination modes by replacing the first raster element 106 by a light manipulation device that permits a controllable variation of an intensity distribution of incident light in the spatial domain and/or in the angular domain within fractions of typical total exposure times.

FIG. 8 shows an exemplary embodiment of a light modulation device 806, designed for a rapid change of its effect function, in the form of a dynamically drivable diffractive optical element (DOE) that has radiation-diffracting structures that can be varied in the short term by external driving in order to bring about a change in the diffractive angular distribution. The light modulation device comprises a plane-parallel plate 820 made from transparent material whose entrance side 821 and exit side 822 are aligned in the installed state in a fashion perpendicular to the optical axis of the illumination system.

A piezoelectric element $P_Y$ is fitted at a lateral surface of the square plate that is aligned perpendicular to the y-direction, and a piezoelectric element $P_X$ is fitted at the neighboring lateral surface, which is perpendicular to the x-direction. A control device can apply an AC voltage to the piezoelectric elements $P_X$, $P_Y$ independently of one another. Consequently, soundwaves can be coupled into the plate 820 with the aid of the piezoelectric elements. By specifically tuning the excitation frequency, standing longitudinal waves are produced in the plate with the result that the plate acts like a phase grating for penetrating light. A light beam 810 incident parallel to the optical axis can thereby be stripped by means of diffraction in two diffracted light beams 811, 812 that run in diametrical directions at the same diffractive angle with respect to the optical axis 803. A dipole light distribution can thereby be produced in the pupil-shaping surface, the diffractive angle determining the radial spacing between the optical axis and the illumination spot formed by a diffracted component beam. The diffractive angle can be changed by adapting the frequency. The degree of extinction can be adapted to the zero diffraction order by varying the amplitude, and so it is further possible to control a redistribution of the light intensity within the diffraction orders.

If, during a first illumination time interval, the piezoelectric element Py is activated, this produces in the plate longitudinal waves that extend in the x-direction and whose wave vector specifying the propagation direction points in the y-direction (FIG. 8(b), top). It is thereby possible to generate illumination poles that are offset from the optical axis in the y-direction. The other piezoelectric element $P_X$ is inactive in this case. If, by contrast, the element $P_X$ is activated, while the element $P_Y$ is inactive (FIG. 8(b), bottom), the result of this is that sound propagates parallel to the x-direction, the waves run in the y-direction, and the diffracted light beams are offset from the optical axis in the x-direction.

Further illumination intensity distributions are possible by simultaneously activating both piezoelectric elements, if appropriate with different amplitudes and/or frequencies.

FIG. 9 shows an embodiment of an illumination system 900 whose pupil-shaping unit 950 permits a very rapid change between different illumination pupils in the pupil-shaping surface 910 without this requiring a variable pupil filtering. With reference to light source 902, beam expander 904, objective 908 and second raster element 909, the design of the illumination system corresponds to that of the system from FIG. 1, for which reason reference is made to this extent to the description there. The input optics 920 arranged downstream of the pupil-shaping surface 910 transmit the light of the intensity distribution onto the rectangular entrance surface 944 of a rod-shaped light integrator 945, which is fabricated from synthetic silica glass or calcium fluoride and mixes and homogenizes the outgoing light by means of multiple internal reflection. The pupil-shaping surface 910 is a Fourier-transformed plane of the entrance surface 944, and so the spatial intensity distribution in the pupil-shaping surface is transformed into an angular distribution at the rod entrance 944. Lying directly at the exit surface 946 of the rod 845 is an intermediate field plane 921 that corresponds to the intermediate field plane 121 of FIG. 1, and a reticle masking system 922 is provided in this plane. The design and function of the down-stream imaging objective 930 and of the projection objective 960 and of the scanning system 970 correspond to those of the corresponding subassemblies in FIG. 1, for which reason reference is made to the description there.

Downstream of the beam expander 904 is a two-dimensional raster arrangement 915 of telescope lens systems 916 that produces from the expander beam 914 a set of regularly arranged, mutually parallel beams 917 that each have a lateral spacing from one another.

The light separated into beams 917 or component beams 917 impinges on a mirror arrangement 920 that serves as a locationally variable light modulation device and is aligned macroscopically at an angle of approximately 45° to the optical axis 903 and effects on average a 90° folding of the optical axis in the manner of a deflecting mirror. Other angular positions and deflecting angles are also possible. The mirror arrangement 920 comprises a multiplicity of individual, small mirrors, in the case of the example flat individual mirrors 921 that border one another directly with very small interspaces and lend the mirror arrangement 920 as a whole a faceted reflecting surface. Each of the individual mirrors of the micro-mirror array 920 can be tilted independently of the other individual mirrors about two tilt axes aligned perpendicular to one another. The tilting movements of the individual mirrors can be controlled by a control device 922 via electric signals to individual drives of the individual mirrors. The mirror arrangement 920 is an essential constituent of the pupil-shaping unit 950, and is used specifically to vary in a spatially resolved fashion the angular distribution of the radiation impinging on the mirror arrangement. The mirror arrangement is arranged in the region of the object plane of the objective 908 that transforms the angular distribution, produced by the mirror arrangement, of the radiation into a spatial distribution in the pupil-shaping surface 910.

The mirror control device 922 is coupled to the scan control device 975 on the wafer scanner in such a way that the position of the individual mirrors can be varied in coordination with the scanning movement during a scanning process in such a way as to set an optimally adapted illumination intensity distribution in the pupil-shaping surface 910 for each pattern area of the reticle. The method can also be applied in the case of illumination systems that have no rod-shaped light integrator (in FIG. 1, for example).

In addition to the dynamic manipulation of the intensity illumination pupil during scanning, the illuminations system in FIG. 1 also permits the initial polarization state of the illumination radiation striking the mask to be varied during scanning in such a way that the various, juxtaposed subregions of the mask pattern are irradiated with illumination light of a different polarization state. The effect is explained with the aid of FIG. 10. The polarization rotator 105, which can be driven by the polarization control device 182 as a function of the scanning operation, has a λ/4 plate that can be rotated about the optical axis. A further retarder device is provided between the beam expander 104 and the polarization rotator in order to convert the linearly polarized entrance light of the laser 102 into circularly polarized light that falls onto the rotating λ/4 plate. The rotational speed of the λ/4 plate is set such that it corresponds to the rotational speed of the pupil filter 115. The preferred polarization direction of the radiation linearly polarized downstream of the λ/4 plate 105 thereby rotates about the optical axis at twice the rotational speed of the λ/4 plate. The initial phase of this rotation is tuned in this case to the initial phase of the rotation of the rotatable pupil filter such that whenever the polarization filter 415 passes the illumination intensity of the illumination spots $411Y_1$ and $411Y_2$ lying in the y-direction (compare FIG. 4) the preferred polarization direction is aligned precisely parallel to the x-direction (compare FIG. 10(a)), and that it is aligned essentially parallel to the y-direction (compare FIG. 10(b)) whenever the intensity of the x-poles $411X_1$ and $411X_2$ is passed. These situations are illustrated schematically in FIG. 10, the double arrows respectively symbolizing the preferred polarization direction, that is to say the direction of oscillation of the electric field vector of the polarized radiation. It may be seen that in this way the produced dipole illumination is carried out in each case with a preferred polarization direction that is perpendicular to the incidence plane of the illumination light, that is to say exhibits s-polarization. This has proved to be very advantageous, particularly in the case of projection systems of high numerical apertures, in the case of which the contrast comes about substantially via two-beam interference.

In the embodiment shown in FIG. 1, the λ/4 plate 105' and the polarization rotator 105 are arranged close to one another between beam widener 104 and the first diffractive optical raster element 106 in the region of enlarged beam cross section. Downstream of the raster element 106, up to the exit plane 140, the illumination system has no optical elements that have a substantial polarization-changing influence such as, for example, rod integrators of the type shown in FIG. 9. In the case of such a polarization-preserving system, it is possible to intervene in the polarization state of the radiation in the immediate vicinity of the laser light source. Consequently, it is provided in the case of another embodiment to arrange both the λ/4 plate and the polarization rotator between laser source and beam widener 104 in the region of small beam diameter and small beam divergence. These optical elements can be designed in this case to be smaller and therefore of less mass, and this is favorable for rapid movement. An arrangement in the parallel beam path is generally favorable for avoiding influences that can result from the angular dependence of the action of polarization-optical elements.

As an alternative to a rotatable λ/4 plate, the polarization rotator can also be formed, for example, by a rotating beam splitter, this variant coming into consideration chiefly for optical systems in which light losses can be tolerated. Also possible are switchable polarization rotators of the type of liquid crystal displays (LCDs) having externally drivable, optically active liquids.

The invention has been described using masks with the aid of which the pattern to be imaged is present as a permanently prescribed structure, for example in the form of a structured chromium layer on a transparent substrate. The term "mask" is also intended in the extended sense to cover such masks as are formed by adjustable devices for producing patterns that can be varied, for example, by an electronic drive. For example, a mask can be formed by a field of LCD elements (LCD array) or by a two-dimensional field of micromirrors (micromirror array) as used in the case of so-called "maskless lithography". In this case the "scanning" of the mask can likewise be carried out by relative movement between the mask and the illumination field of the illumination system. It is also possible as an alternative to implement a scanning process by virtue of the fact that the device for producing patterns remains immobile as a whole, while by suitably driving the individual elements of the device for producing patterns (for example LCD cells or micromirrors) a pattern running over the surface of the mask arrangement is produced, in which case different angular distributions of the illumination radiation are then produced in a suitable way depending on the type of pattern in the illumination field. As explained, for example, with the aid of FIG. 3, a pattern can be subdivided into more than two subpatterns, for example in three, four, five, six, seven, eight, nine, ten or more subpatterns.

The invention claimed is:

1. A projection exposure method for exposing a radiation-sensitive substrate, arranged in the region of an image surface of a projection objective, the projection exposure method comprising:
    arranging a mask in an object surface of the projection objective, the mask having a first pattern area with a first subpattern, and at least one second pattern area, arranged laterally offset from the first pattern area; with a second subpattern;
    illuminating the mask with illumination radiation derived from a pulsed laser, the pulse laser being configured to generate pulses at a clock frequency;
    setting a defined, local illumination intensity distribution of the illumination radiation in a pupil-shaping surface of an illumination system;
    scanning the mask to irradiate the first subpattern and thereafter the second subpattern with the illumination radiation;
    illuminating the first subpattern with illumination radiation having a first angular distribution, adapted to the first subpattern, during a first illumination time interval; and
    subsequently illuminating the second subpattern with illumination radiation having a second angular distribution, adapted to the second subpattern, during a second illumination time interval, the second angular distribution differing from the first angular distribution, wherein a rate of change between the first and second angular distributions is on the order of magnitude of the clock frequency of the pulsed laser.

2. The projection exposure method as claimed in claim 1, further comprising:
    setting a first illumination intensity distribution, adapted to the first subpattern, in the pupil-shaping surface of the illumination system;
    illuminating the first subpattern with the aid of the first illumination intensity distribution within the first illumination time interval;
    varying the illumination intensity distribution in the pupil-shaping surface in order to produce a second illumination intensity distribution that differs from the first illumination intensity distribution; and
    illuminating the second subpattern with the aid of the second illumination intensity distribution within a second illumination time interval following the first illumination time interval.

3. The projection exposure method as claimed in claim 2, further comprising:
    setting a basic illumination intensity distribution in the pupil-shaping surface of the illumination system, the basic illumination intensity distribution being substantially a superposition of the first and second illumination intensity distributions;
    masking out a fraction, corresponding to the second illumination intensity distribution, of the basic illumination intensity distribution in order to produce the first illumination intensity distribution; and
    subsequently masking out from the basic illumination intensity distribution in order to produce the second illumination intensity distribution a fraction, corresponding to the first illumination intensity distribution, of the basic illumination intensity distribution.

4. The projection exposure method as claimed in claim 2, wherein, during a total exposure time that includes the first illumination time interval and the second illumination time interval, a variably drivable pupil-shaping unit for receiving light of a primary light source and for producing a variably settable local illumination intensity distribution in the pupil-shaping surface of the illumination system is used firstly to set a first illumination intensity distribution corresponding to the first angular distribution, and thereafter to set a second illumination intensity distribution corresponding to the second angular distribution.

5. The projection exposure method as claimed in claim 1, further comprising:
    setting a basic illumination intensity distribution in the pupil-shaping surface of the illumination system, the basic illumination intensity distribution being substantially a superposition of the first and second illumination intensity distributions;
    masking out a fraction, corresponding to the second illumination intensity distribution, of the basic illumination intensity distribution in order to produce the first illumination intensity distribution; and
    subsequently masking out from the basic illumination intensity distribution in order to produce the second illumination intensity distribution a fraction, corresponding to the first illumination intensity distribution, of the basic illumination intensity distribution.

6. The projection exposure method as claimed in claim 5, wherein at least one transmission filter device that has a spatially variable transmission function is used to mask out a fraction of the basic illumination intensity distribution.

7. The projection exposure method as claimed in claim 6, wherein at least one reflection filter device that has a spatially variable reflection function is used in order to mask out a fraction of the initial illumination intensity distribution.

8. The projection exposure method as claimed in claim 6, wherein the masking out of a fraction of the basic illumination intensity distribution is carried out with the aid of at least one moveable diaphragm device that has at least one diaphragm opening which can move relative to the basic illumination intensity distribution and is moved such that, during the movement of the diaphragm device, initially a fraction of the illumination intensity that corresponds to the second illumination intensity distribution, and thereafter a fraction that corresponds to the first illumination intensity distribution are masked out from the basic illumination intensity distribution.

9. The projection exposure method as claimed in claim 6, wherein, during a total exposure time that includes the first illumination time interval and the second illumination time interval, a variably drivable pupil-shaping unit for receiving light of a primary light source and for producing a variably settable local illumination intensity distribution in the pupil-shaping surface of the illumination system is used firstly to set a first illumination intensity distribution corresponding to the first angular distribution, and thereafter to set a second illumination intensity distribution corresponding to the second angular distribution.

10. The projection exposure method as claimed in claim 5, wherein at least one reflection filter device that has a spatially variable reflection function is used in order to mask out a fraction of the initial illumination intensity distribution.

11. The projection exposure method as claimed in claim 10, wherein the masking out of a fraction of the basic illumination intensity distribution is carried out with the aid of at least one moveable diaphragm device that has at least one diaphragm opening which can move relative to the basic illumination intensity distribution and is moved such that, during the movement of the diaphragm device, initially a fraction of the illumination intensity that corresponds to the second illumination intensity distribution, and thereafter a fraction that corresponds to the first illumination intensity distribution are masked out from the basic illumination intensity distribution.

12. The projection exposure method as claimed in claim 10, wherein, during a total exposure time that includes the first illumination time interval and the second illumination time interval, a variably drivable pupil-shaping unit for receiving light of a primary light source and for producing a variably settable local illumination intensity distribution in the pupil-shaping surface of the illumination system is used firstly to set a first illumination intensity distribution corresponding to the first angular distribution, and thereafter to set a second illumination intensity distribution corresponding to the second angular distribution.

13. The projection exposure method as claimed in claim 5, wherein the masking out of a fraction of the basic illumination intensity distribution is carried out with the aid of at least one moveable diaphragm device that has at least one diaphragm opening which can move relative to the basic illumination intensity distribution and is moved such that, during the movement of the diaphragm device, initially a fraction of the illumination intensity that corresponds to the second illumination intensity distribution, and thereafter a fraction that corresponds to the first illumination intensity distribution are masked out from the basic illumination intensity distribution.

14. The projection exposure method as claimed in claim 5, wherein, during a total exposure time that includes the first illumination time interval and the second illumination time interval, a variably drivable pupil-shaping unit for receiving light of a primary light source and for producing a variably settable local illumination intensity distribution in the pupil-shaping surface of the illumination system is used firstly to set a first illumination intensity distribution corresponding to the first angular distribution, and thereafter to set a second illumination intensity distribution corresponding to the second angular distribution.

15. The projection exposure method as claimed in claim 1, wherein, during a total exposure time that includes the first illumination time interval and the second illumination time interval, a variably drivable pupil-shaping unit for receiving light of a primary light source and for producing a variably settable local illumination intensity distribution in the pupil-shaping surface of the illumination system is used firstly to set a first illumination intensity distribution corresponding to the first angular distribution, and thereafter to set a second illumination intensity distribution corresponding to the second angular distribution.

16. The projection exposure method as claimed in claim 15, wherein the pupil-shaping unit includes at least one light manipulation device for controllably varying an intensity distribution of incident light, and during the total exposure time the light manipulation device is switched over at least once between a first configuration and a second configuration differing therefrom.

17. The projection exposure method as claimed in claim 1, wherein an illumination field of the illumination system remains constant with reference to shape and/or size during a total exposure time that includes the first illumination time interval and the second illumination time interval.

18. The projection exposure method as claimed in claim 1, wherein an angularly dependent variation of the illumination radiation is introduced between the first and second illumination time intervals in the region of a field plane of the projection system upstream of the pattern.

19. The projection exposure method as claimed in claim 1, wherein a variable setting of the output polarization state is carried out with the aid of at least one polarization manipulation device, the latter being switched over at least once between a first configuration and a second configuration within a total exposure time such that the first subpattern is imaged with a first output polarization state, and the second subpattern is imaged with a second output polarization state differing therefrom.

20. The projection exposure method as claimed in claim 1, wherein a dipole illumination having two illumination intensity maxima offset in a first direction from the optical axis is set in the first illumination time interval, and a second dipole illumination, angularly offset from the first dipole illumination and having two illumination intensity maxima offset in a second direction with respect to the optical axis is set in a second illumination time interval, with the output polarization state being set such that for each dipole illumination a preferred polarization direction of the illumination radiation is aligned substantially perpendicular to a straight line connecting the illumination intensity maxima of the dipole illumination (s-polarization).

21. A method, comprising:
  illuminating a first subpattern of a mask with pulsed radiation during a first time interval, the radiation having a first angular distribution during the first time interval;
  after the first time interval, moving the mask and illuminating a second subpattern of the mask with pulsed radiation during a second time interval, the radiation having a second angular distribution during the first second interval,
  wherein:
    the second subpattern of the mask is different from the first subpattern of the mask;
    the second angular distribution of the radiation is different from the first angular distribution of the radiation;

the pulsed radiation has a pulse frequency; and
a rate of change between the first and second angular distributions is on the order of magnitude of the pulse frequency.

22. The method of claim 21, further comprising:
using an illumination system to illuminate the first and second subpatterns of the mask; and
setting a local illumination intensity distribution in a pupil-shaping surface of the illumination system.

23. The method of claim 22, further comprising:
setting a first local illumination intensity distribution in the pupil-shaping surface of the illumination system to provide the first angular distribution of the radiation; and
setting a second local illumination intensity distribution in the pupil-shaping surface of the illumination system to provide the second angular distribution of radiation,
wherein the second local illumination intensity distribution is different from the first local illumination intensity distribution.

24. The method of claim 21, wherein:
the mask is in an object plane of a projection objective; and
the method further comprises using the projection objective to project an image of the mask onto a light-sensitive material.

25. The method of claim 21, further comprising using a pulsed laser to provide the pulsed radiation.

* * * * *

UNITED STATES PATENT AND TRADEMARK OFFICE
CERTIFICATE OF CORRECTION

PATENT NO. : 9,110,383 B2
APPLICATION NO. : 13/299062
DATED : August 18, 2015
INVENTOR(S) : Aksel Goehnermeier It is certified that error appears in the above-identified patent and that said Letters Patent is hereby corrected as shown below:

Specification

Col. 6, make lines 5-10 a continuation of the same paragraph on line 4.

Col. 10, line 52, delete "down-stream" and insert -- downstream --.

Col. 14, line 59, delete "quadropule" and insert -- quadrupole --.

Col. 18, line 30, delete "varled" and insert -- varied --.

Col. 18, line 61, delete "Py" and insert -- $P_y$ --.

Col. 19, line 30, delete "down-stream" and insert -- downstream --.

Signed and Sealed this
Fifteenth Day of March, 2016

Michelle K. Lee
*Director of the United States Patent and Trademark Office*